(12) United States Patent
Chung (10) Patent No.: US 7,767,565 B2
(45) Date of Patent: Aug. 3, 2010

(54) SEMICONDUCTOR DEVICE AND METHOD OF FABRICATING THE SAME

(75) Inventor: Sung Woon Chung, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 235 days.

(21) Appl. No.: 11/966,578

(22) Filed: Dec. 28, 2007

(65) Prior Publication Data

US 2009/0108341 A1    Apr. 30, 2009

(30) Foreign Application Priority Data

Oct. 31, 2007    (KR) .................... 10-2007-0110696

(51) Int. Cl.
*H01L 21/00* (2006.01)
(52) U.S. Cl. .................. 438/585; 438/589; 438/268; 257/329; 257/347
(58) Field of Classification Search ............. 438/585, 438/589, 268; 257/329, 347
See application file for complete search history.

(56) References Cited

U.S. PATENT DOCUMENTS

| | | | | |
|---|---|---|---|---|
| 4,449,285 A | * | 5/1984 | Janes et al. ................. | 438/268 |
| 5,874,760 A | * | 2/1999 | Burns et al. ................. | 257/315 |
| 5,888,864 A | * | 3/1999 | Koh et al. ................... | 438/253 |
| 5,929,477 A | * | 7/1999 | McAllister Burns et al. | 257/306 |
| 5,990,509 A | * | 11/1999 | Burns et al. ................. | 257/296 |
| 6,013,548 A | * | 1/2000 | Burns et al. ................. | 438/242 |
| 6,033,957 A | * | 3/2000 | Burns et al. ................. | 438/270 |
| 6,034,389 A | * | 3/2000 | Burns et al. ................. | 257/301 |
| 6,040,210 A | * | 3/2000 | Burns et al. ................. | 438/238 |
| 6,077,745 A | * | 6/2000 | Burns et al. ................. | 438/270 |
| 6,114,725 A | * | 9/2000 | Furukawa et al. .......... | 257/330 |
| 6,329,239 B2 | * | 12/2001 | Koh et al. ................... | 438/253 |
| 6,580,124 B1 | | 6/2003 | Cleeves et al. | |
| 7,586,130 B2 | * | 9/2009 | Kawashima et al. ........ | 257/135 |
| 7,670,909 B2 | * | 3/2010 | Cho ............................ | 438/268 |
| 2001/0032989 A1 | * | 10/2001 | Koh et al. ................... | 257/296 |
| 2008/0277741 A1 | * | 11/2008 | Cha ............................ | 257/401 |
| 2009/0004797 A1 | * | 1/2009 | Lee ............................ | 438/270 |
| 2009/0004813 A1 | * | 1/2009 | Lee ............................ | 438/421 |

(Continued)

FOREIGN PATENT DOCUMENTS

KR    1020040000069 A    1/2004

(Continued)

*Primary Examiner*—Laura M Menz
(74) *Attorney, Agent, or Firm*—Townsend and Townsend and Crew LLP (57) ABSTRACT

A method of fabricating a semiconductor device includes forming a first vertical pillar over a semiconductor substrate. A spacer is formed over a sidewall of the first vertical pillar. A portion of the semiconductor substrate exposed between the first vertical pillars is etched to form a recess that exposes a second vertical pillar extending below from the first vertical pillar. A sacrificial film is formed over the semiconductor substrate including the recess and a sidewall of the first vertical pillar to fill the recess, the second vertical pillar and the first vertical pillar. A supporting layer is deposited over the sacrificial film and the first vertical pillar. The supporting layer is patterned to form a supporting pattern connecting the first vertical pillar with each other. The sacrificial film is removed to expose the second vertical pillar. A surrounding gate is formed over a sidewall of the second vertical pillar.

16 Claims, 7 Drawing Sheets

U.S. PATENT DOCUMENTS

| | | | |
|---|---|---|---|
| 2009/0004861 A1* | 1/2009 | Lee et al. | 438/692 |
| 2009/0008743 A1* | 1/2009 | Lee et al. | 257/532 |
| 2009/0026541 A1* | 1/2009 | Chung | 257/347 |
| 2009/0108340 A1* | 4/2009 | Seo | 257/329 |
| 2009/0108341 A1* | 4/2009 | Chung | 257/329 |
| 2009/0114981 A1* | 5/2009 | Sung et al. | 257/329 |
| 2009/0159964 A1* | 6/2009 | Lee | 257/329 |
| 2009/0159965 A1* | 6/2009 | Jung | 257/331 |
| 2009/0163000 A1* | 6/2009 | Cho et al. | 438/492 |
| 2009/0163006 A1* | 6/2009 | Lee | 438/585 |
| 2009/0163011 A1* | 6/2009 | Jung | 438/589 |
| 2009/0163017 A1* | 6/2009 | Cho | 438/595 |
| 2009/0163027 A1* | 6/2009 | Yi | 438/700 |
| 2009/0170275 A1* | 7/2009 | Ban | 438/421 |
| 2009/0218616 A1* | 9/2009 | Jang et al. | 257/330 |
| 2009/0230466 A1* | 9/2009 | Kim | 257/331 |
| 2009/0236656 A1* | 9/2009 | Sung et al. | 257/329 |
| 2009/0242945 A1* | 10/2009 | Cho et al. | 257/288 |
| 2009/0242971 A1* | 10/2009 | Cho et al. | 257/328 |
| 2009/0242972 A1* | 10/2009 | Cho | 257/329 |
| 2009/0250732 A1* | 10/2009 | Kim | 257/288 |
| 2009/0250748 A1* | 10/2009 | Kim | 257/329 |
| 2009/0253236 A1* | 10/2009 | Cho et al. | 438/268 |
| 2009/0253254 A1* | 10/2009 | Park et al. | 438/585 |
| 2009/0258467 A1* | 10/2009 | Kim | 438/270 |
| 2009/0291551 A1* | 11/2009 | Cho | 438/585 |
| 2009/0317954 A1* | 12/2009 | Kim | 438/268 |
| 2010/0025758 A1* | 2/2010 | Cho | 257/329 |

FOREIGN PATENT DOCUMENTS

| | | |
|---|---|---|
| KR | 1020040057628 A | 7/2004 |
| KR | 1020050030986 A | 4/2005 |

* cited by examiner

SEMICONDUCTOR DEVICE AND METHOD OF FABRICATING THE SAME

CROSS-REFERENCES TO RELATED APPLICATIONS

The priority of Korean patent application number 10-2007-0110696, filed on Oct. 31, 2007, which is incorporated by reference in its entirety, is claimed.

BACKGROUND OF THE INVENTION

The present invention generally relates to a semiconductor device. More particularly, the present invention relates to a semiconductor device including a vertical transistor and a method of fabricating the same.

In the case of semiconductor devices such as a DRAM, high technology is required to include more transistors in a limited area, thereby increasing a degree of integration. As a result, a vertical transistor has been suggested in which memory cells are located in a small area. In the case of memory devices, the vertical transistor has a surrounding gate structure that surrounds a vertical channel of the transistor.

A channel region is selectively isotropic-etched to form the surrounding gate in 4F2 so that the channel region is thinner than a source/drain region, thereby obtaining an excellent device characteristic. As a result, the vertical transistor can effectively use a limited area. Also, the vertical transistor has been spotlighted as a transistor in various fields as well as DRAM because it is easy to obtain a smaller-sized transistor.

In the manufacture of semiconductor devices, the degree of integration has to be increased to form more devices in a limited area. For improvement of the degree of integration, a vertical transistor is formed. The vertical transistor includes memory cells in a small area. The vertical transistor includes a surrounding gate structure that surrounds a vertical channel structure.

Although the device area is reduced, the vertical transistor maintains an effective channel length, thereby providing an effective structure against Short Channel Effect (SCE). The surrounding gate maximizes controllability of a gate, thereby improving the characteristic for SCE. The surrounding gate also has an excellent operating current characteristic because the current flowing area is the greatest as compared with other gate structures. In order to increase the degree of integration, the vertical transistor is required to have a slender and taller structure.

However, a memory cell having a line width of less than 50 nm has a very thin channel structure, which can collapse. The danger of the collapse associated with such a thin channel structure hinders high-integration of the vertical transistor. The vertical transistor having a regular thickness is structurally stable, but the vertical transistor having irregular thickness degrades a structural stability. The unstable vertical transistor can collapse in a subsequent process and generate particles over a wafer, thereby reducing yield of the device. As a cross-sectional area of the vertical transistor is decreased, the vertical transistor may be broken when uniformity is poor during a locally isotropic etching process.

SUMMARY OF THE INVENTION

Embodiments of the present invention are directed to a semiconductor device including a vertical transistor. According to one embodiment of the present invention, during a process of forming a plurality of vertical transistors, a supporting pattern is formed over a plurality of vertical channels each of which is expected to be a body of the vertical transistor. As a result, the vertical channel is prevented from collapsing and leaning in a subsequent process. Accordingly, high integration and yield of the device can be improved.

According to an embodiment of the present invention, a method of fabricating a semiconductor device includes: forming a first vertical pillar over a semiconductor substrate. A spacer is formed over a sidewall of the first vertical pillar. A portion of the semiconductor substrate exposed between the first vertical pillars is etched to form a recess that exposes a second vertical pillar extending below from the first vertical pillar. A sacrificial film is formed over the semiconductor substrate including the recess and a sidewall of the first vertical pillar to fill the recess, the second vertical pillar and the first vertical pillar. A supporting layer is formed over the sacrificial film and the first vertical pillar. The supporting layer is patterned to form a supporting pattern connecting the first vertical pillar with each other. The sacrificial film is removed to expose the second vertical pillar. A surrounding gate is formed over a sidewall of the second vertical pillar.

According to an embodiment of the present invention, a semiconductor device includes: a vertical transistor fabricated by the above described method.

DESCRIPTION OF EMBODIMENTS

The present invention relates to a semiconductor device including a vertical transistor. According to an embodiment of the present invention, the semiconductor device includes a pattern for supporting a plurality of vertical channels, each of which serves as a body of a vertical transistor.

FIGS. 1a to 1j are cross-sectional views illustrating a method of fabricating a semiconductor device according to an embodiment of the present invention. A pad oxide film 112 and a mask layer (not shown) are formed over a semiconductor substrate 110. The mask layer is patterned using a mask that defines a channel region to form a mask pattern 114. A portion of pad oxide film 112 and semiconductor substrate 110 is etched using mask pattern 114 as an etching mask to form a first vertical pillar 120. First vertical pillar 120 is defined as a source/drain region. In the case of a DRAM, first vertical pillar 120 is electrically connected to a capacitor.

Figure 1A:
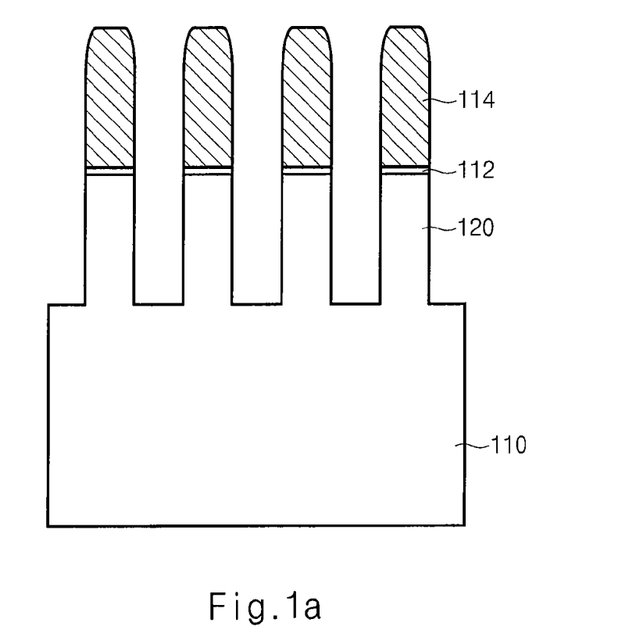
FIGS. 1a to 1j are cross-sectional views illustrating a method of fabricating a semiconductor device according to an embodiment of the present invention.

The mask layer includes one selected from a group consisting of a silicon oxide film, a silicon nitride film and a combination thereof. The silicon oxide film is formed by a chemical vapor deposition (CVD) method with TEOS(Si(OC$_2$H$_5$)$_4$) or SiH$_4$ as a source gas. The silicon nitride film is formed by a low pressure chemical vapor deposition (LPCVD) method with SiH$_2$Cl$_2$ and NH$_3$ as a source gas.

The mask layer has a thickness in the range of about 500 Å to 5,000 Å. The mask layer has an etching rate that is less than half of the etching rate of the semiconductor substrate 110. The top surface of mask pattern 114 is circular or polygonal.

Although the top surface of mask pattern 114 is formed to be circular in the embodiment of the present invention, it is not limited.

Figure 1B:
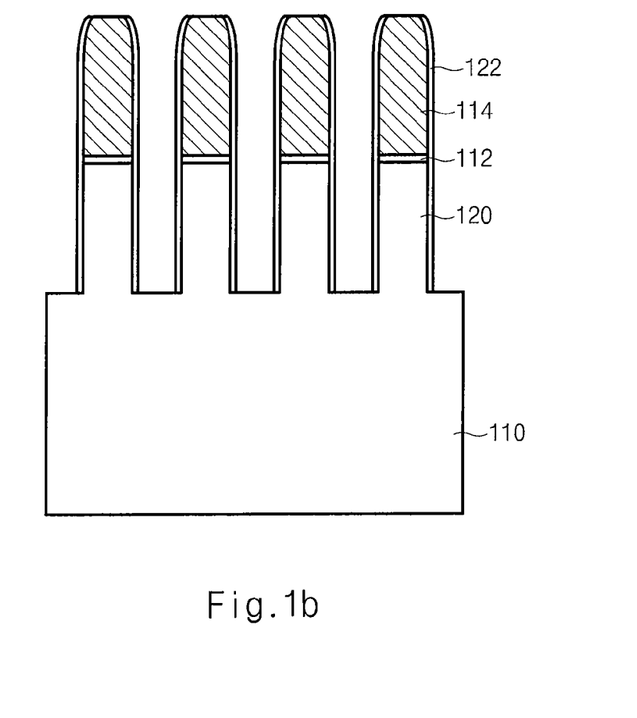

Referring to FIG. 1b, a first insulating film (not shown) is formed over semiconductor substrate 110, first vertical pillar 120 and mask pattern 114. The first insulating film is dry-etched to form a spacer 122 at a sidewall of first vertical pillar 120, pad oxide film 112 and mask pattern 114. The first insulating film includes a silicon nitride film. The silicon nitride film is formed by a LPCVD method with $SiH_2Cl_2$ and $NH_3$ as a source gas or an atomic layer deposition (ALD) method. Spacer 122 is formed to have a thickness in the range of about 50 Å to 200 Å. The thickness of spacer 122 may be adjusted considering thickness of a gate insulating film and a surround gate electrode.

Figure 1C:
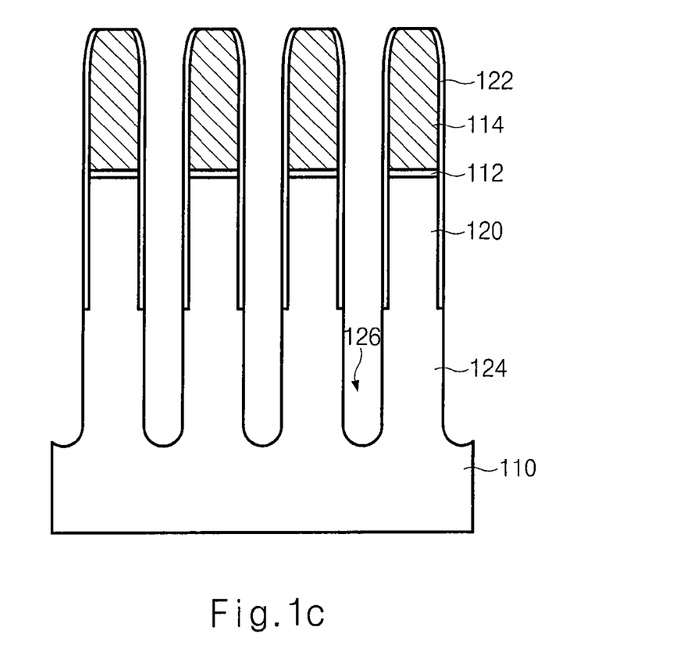

Referring to FIG. 1c, a portion of semiconductor substrate 110 exposed in first vertical pillar 120 is selectively etched using spacer 122 and mask pattern 114 as an etching mask to form a recess 126 that exposes a second vertical pillar 124 extending below the first vertical pillar 120. The selective etching process for forming second vertical pillar 124 is performed by a dry etching method. The depth of second vertical pillar 124 may be adjusted depending upon a size of a subsequent surrounding gate electrode.

Figure 1D:
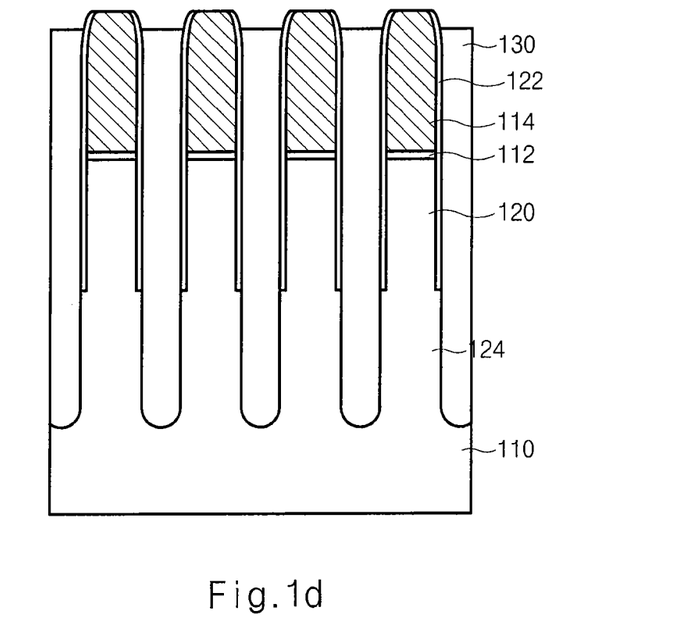

Referring to FIG. 1d, a sacrificial film 130 is formed over semiconductor substrate 110 including recess 126 and a sidewall of first vertical pillar 120 to fill recess 126, first vertical pillar 120 and the second vertical pillar 124. Sacrificial film 130 is planarized until the top surface of first vertical pillar 120 is exposed. Sacrificial film 130 includes a silicon oxide film formed by a plasma CVD method or a high density plasma chemical vapor deposition (HDP CVD) method with $TEOS(Si(OC_2H_5)_4)$ or $SiH_4$ as a source gas. A liquid including Siloxane, Silsesquioxane, or $SiOH_4$ is deposited or coated over semiconductor substrate 110, and then thermally treated at a temperature in the range of about 300° C. to 800° C., thereby obtaining sacrificial film 130. Also, sacrificial film 130 includes a silicon oxide film formed by a CVD method using a source gas selected from the group consisting of TEOS, $O_2$, $N_2O$, $O_3$, and combinations thereof under a pressure in the range of about 1 mTorr to 760 mTorr. Sacrificial film 130 is planarized by a chemical mechanical polishing (CMP) method or an etch-back method.

Figure 1E:
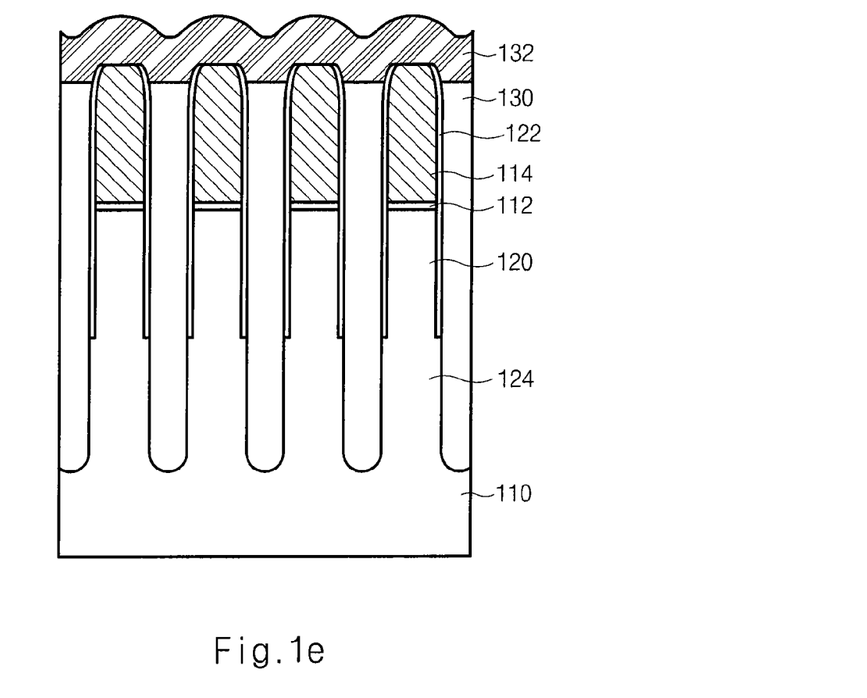
Figure 1F:
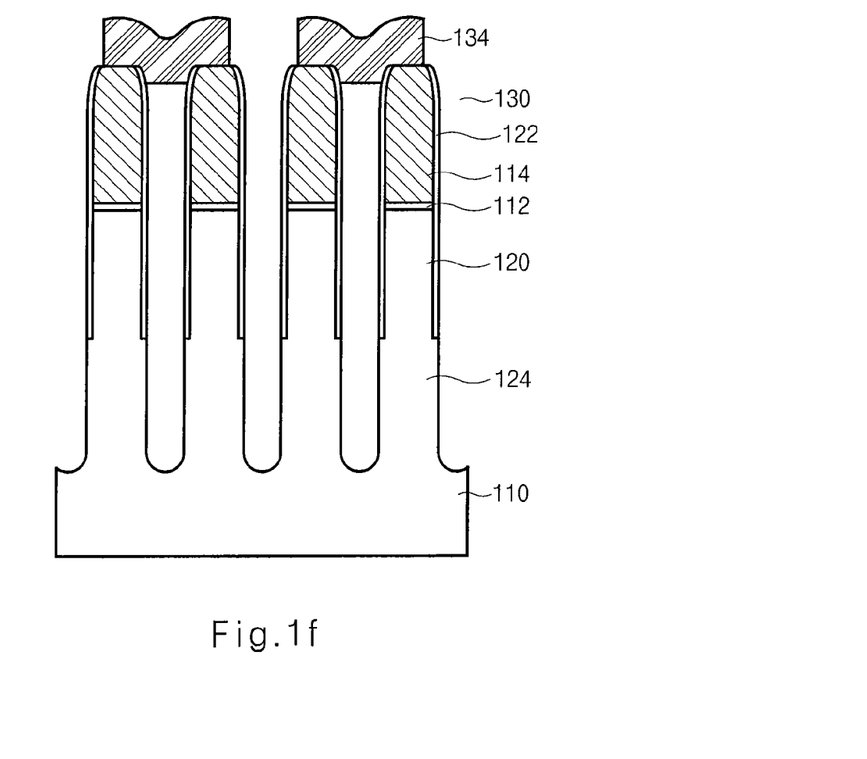

Referring to FIGS. 1e and 1f, a supporting layer 132 is formed over sacrificial film 130 and first vertical pillar 120. Supporting layer 132 is patterned to form a supporting pattern 134 in order to prevent collapsing and leaning of vertical pillars 120 and 124. Sacrificial film 130 exposed between supporting patterns 134 is removed to expose second vertical pillar 124. Sacrificial film 130 can be removed by chemical materials penetrated through sides of vertical pillars 120 and 124 even though supporting pattern 134 is formed over first vertical pillars 120. The etching condition and the etching rate of supporting pattern 134 and sacrificial film 130 may be regulated to not separate supporting pattern 134 from sacrificial film 130.

Supporting layer 132 includes one selected from the group consisting of a silicon oxide film, a silicon nitride film, a silicon nitride film, a polysilicon layer and combinations thereof. The silicon oxide film is formed by a HDP CVD method or a plasma CVD method with $TEOS(Si(OC_2H_5)_4)$ or $SiH_4$ as a source gas. The silicon nitride film is formed by a plasma CVD method and a LPCVD method with a source gas including $SiH_2Cl_2$, $NH_3$, $N_2$, and combinations thereof. Supporting layer 132 is formed to have a thickness in the range of about 200 Å to 2000 Å. Supporting layer 132 is formed of a material and thickness to create a supporting pattern when sacrificial film 130 and semiconductor substrate 110 are etched to form a vertical channel.

Figure 2:
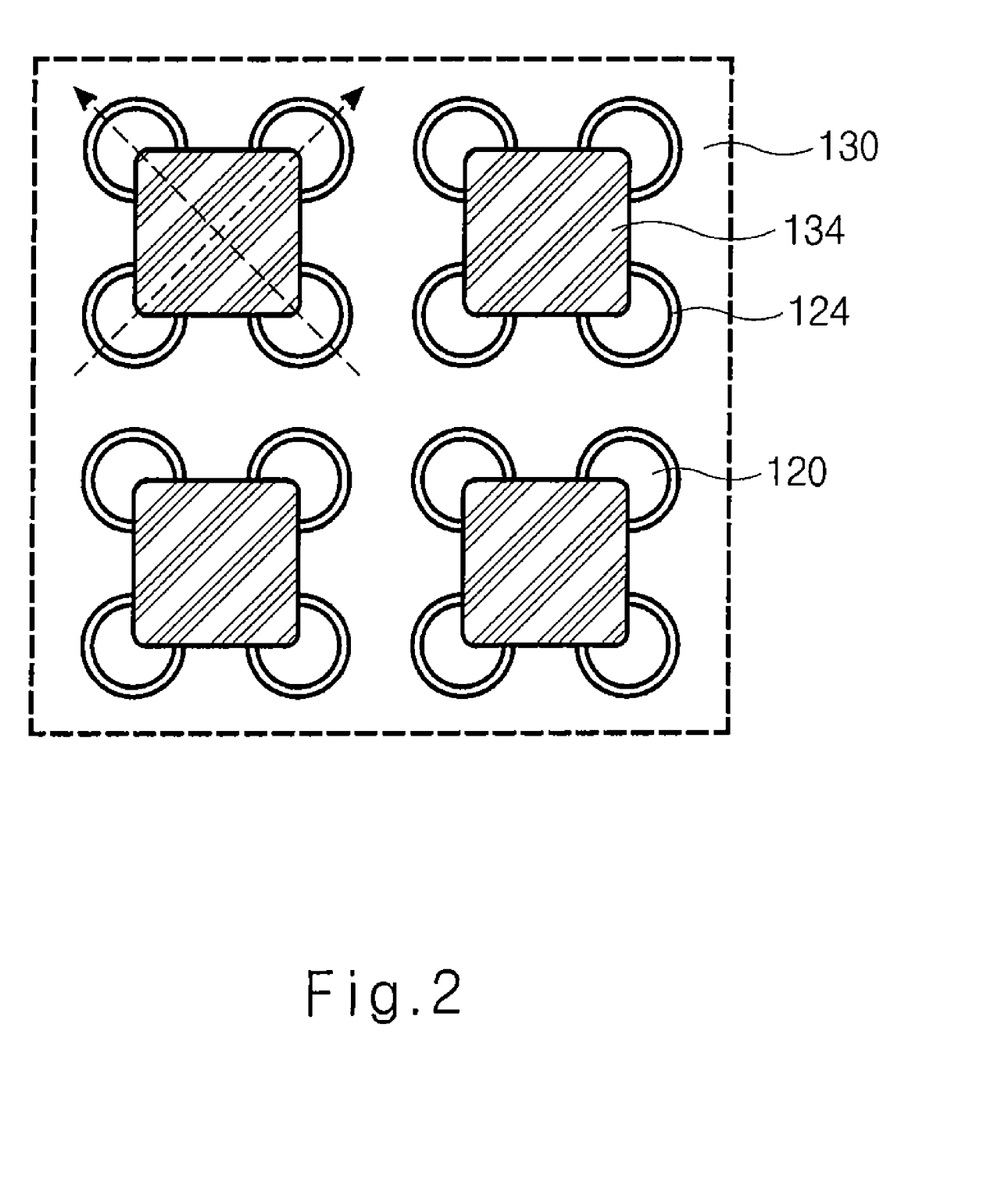
FIG. 2 is a top-view illustrating a method of fabricating a semiconductor device according to an embodiment of the present invention.

Supporting pattern 134 connects at least four vertical pillars 120 and 124 with each other. Supporting pattern 134 diagonally connects at least two vertical pillars 120 and 124 with each other. For example, supporting pattern 134 for connecting four vertical pillars 120 and 124 may disperse a stress given to vertical pillars 120 and 124. As a result, a large stress on one of the vertical pillars 120 and 124 is distributed to form smaller stresses on the four vertical pillars 120 and 124 (see FIG. 2).

Sacrificial film 130 is etched using a wet etching method including HF. Sacrificial film 130 may be etched using a dry etching method having an excellent selectivity characteristic. In addition, the dry etching method includes an isotropic etching method with a remote plasma source.

Figure 1G:
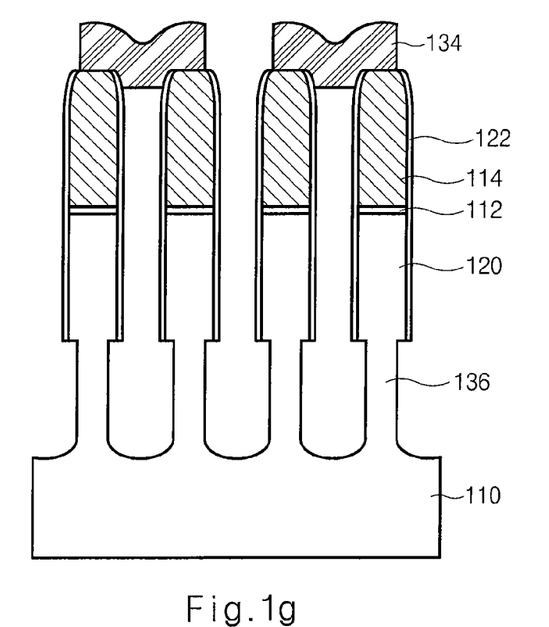
Figure 3:
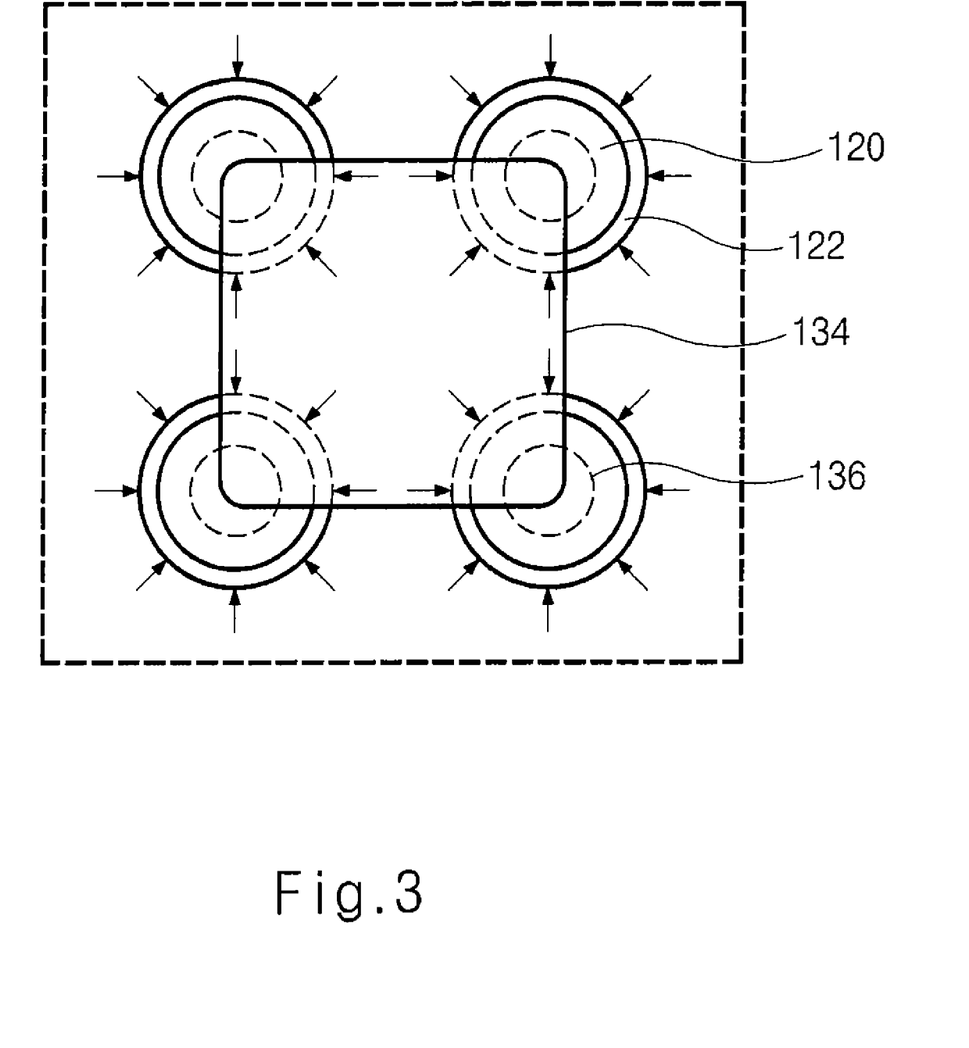
FIG. 3 is a conceptual view illustrating a method of fabricating a semiconductor device according to an embodiment of the present invention.

Referring to FIG. 1g, a portion of second vertical pillar 124 is etched by performing an isotropic etching process on semiconductor substrate 110 so that a third vertical pillar 136 smaller than first vertical pillar 120 is formed. Third vertical pillar 136 serves as a channel. Vertical pillars 120 and 136 may collapse or be broken by a stress difference (i.e., mechanical torque) applied to first vertical pillar 120 and third vertical pillar 136 in the etching process. However, supporting pattern 134 is located over vertical pillars 120 and 136 to reduce a stress given to vertical pillars 120 and 136. As a result, the stress can be more effectively dispersed than when cross-sections of vertical pillars 120 and 136 are twice increased. Supporting pattern 134 prevents collapsing of vertical pillars 120 and 136 (see FIG. 3).

Figure 1H:
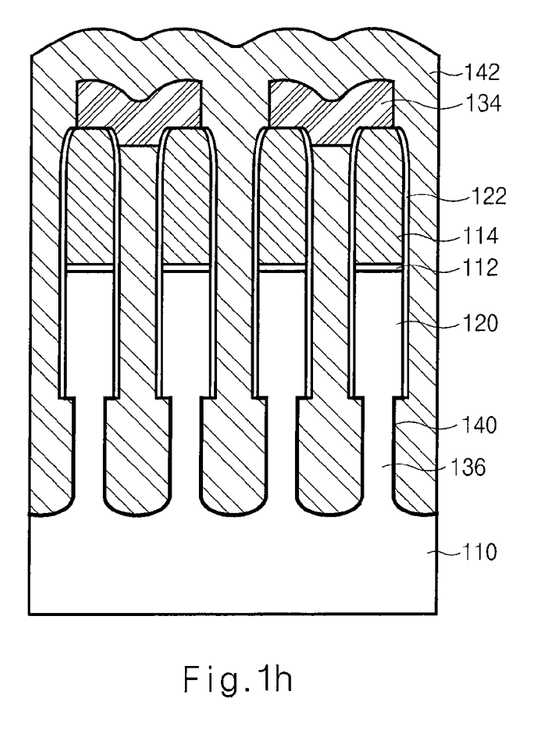
Figure 1I:
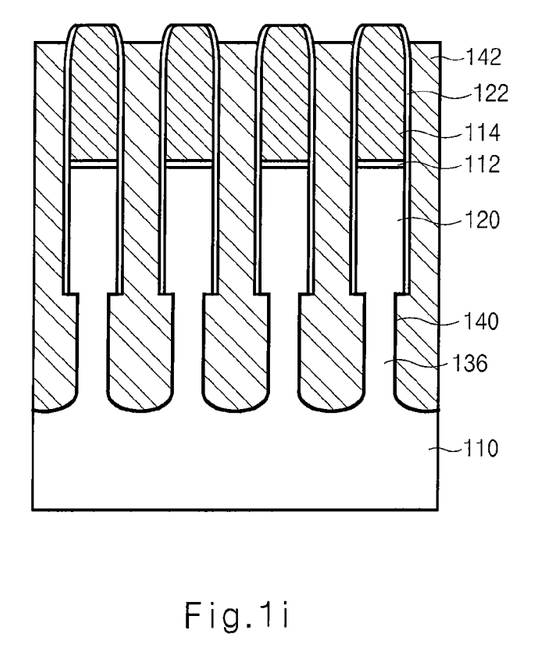

Referring to FIGS. 1h and 1i, a gate insulating film 140 is formed over a surface of semiconductor substrate 110 and third vertical pillar 136 exposed at the lower portion of first vertical pillar 120. A conductive layer 142 is formed over gate insulating film 140, first vertical pillar 120 and supporting pattern 134 to fill first and third vertical pillars 120 and 136. Conductive layer 142 is planarized until mask pattern 114 is exposed, thereby removing supporting pattern 134. Even though supporting pattern 134 is removed, vertical pillars 120 and 136 are supported by conductive layer 142.

Gate insulating film 140 includes a silicon oxide film formed under a temperature in the range of about 200° C. to 1000° C. in an atmosphere of gas selected from $O_2$, $H_2O$, $H_2$, $O_3$ and combinations thereof. Gate insulating film 140 has a thickness in the range of about 1 nm to 100 nm.

Conductive layer 142 is formed of one selected from a group consisting of a polysilicon layer, a metal layer and a combination thereof. The polysilicon layer is formed of an undoped polysilicon layer and a polysilicon layer implanted with impurities. The impurities include phosphorous (P) or boron (B). The metal layer includes one selected from a group consisting of a titanium (Ti) layer, a titanium nitride (TiN) film, a tantalum nitride (TaN) film, a tungsten (W) layer, a copper (Cu) layer, a tungsten silicide ($WSi_x$) layer and combinations thereof.

Figure 1J:
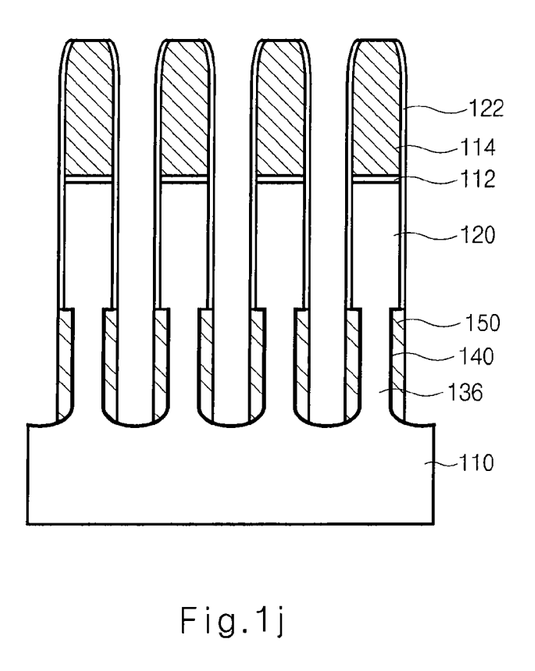

Referring to FIG. 1j, conductive layer 142 is selectively etched using mask pattern 114 as a mask to form a surrounding gate electrode 150 that surrounds third vertical pillar 134. A torque applied to vertical pillars 120 and 136 is supported by gate electrode 150, thereby preventing collapsing of vertical pillars 120 and 136. Subsequent processes are performed using well known processes including a process of forming a word line, a process of forming a bit line, and so on, to obtain a vertical transistor.

As described above, according to an embodiment of the present invention, a chip area may be decreased by significantly reducing an area of a memory cell region, thereby increasing the number of dies. As a result, the manufacturing cost of semiconductor devices can be reduced. A vertical semiconductor device includes a surrounding gate to reduce a short channel effect. The vertical semiconductor device may have a small cross sectional area and a long channel length. Also, a supporting pattern prevents collapsing and leaning of a vertical channel, thereby improving yield of the device.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A method of fabricating a semiconductor device, the method comprising:
    forming a first vertical pillar over a semiconductor substrate;
    forming a spacer over a sidewall of the first vertical pillar;
    etching a portion of the semiconductor substrate exposed between the first vertical pillars to form a recess that exposes a second vertical pillar extending below from the first vertical pillar;
    forming a sacrificial film over the semiconductor substrate including the recess and a sidewall of the first vertical pillar to fill the recess, the second vertical pillar and the first vertical pillar;
    forming a supporting layer over the sacrificial film and the first vertical pillar;
    patterning the supporting layer to form a supporting pattern connecting the first vertical pillar with each other;
    removing the sacrificial film to expose the second vertical pillar; and
    forming a surrounding gate over a sidewall of the second vertical pillar.

2. The method of claim 1, wherein the process of forming the first vertical pillar comprises:
    forming a mask pattern over the semiconductor substrate to define the first vertical pillar; and
    etching a portion of the semiconductor substrate using the mask pattern as an etching mask.

3. The method of claim 2, wherein the mask pattern comprises a silicon nitride film with a thickness in the range of about 500 Å to about 5,000 Å.

4. The method of claim 2, wherein a top surface of the mask pattern is circular or polygonal.

5. The method of claim 1, wherein the supporting pattern connects at least four of the first vertical pillars.

6. The method of claim 5, wherein the supporting pattern respectively connects at least two of the first vertical pillars along a first direction and a second direction crossing each other.

7. The method of claim 1, wherein the supporting layer comprises a silicon oxide film or a silicon nitride film with a thickness in the range of about 200 Å to about 2,000 Å.

8. The method of claim 1, wherein the process of removing the sacrificial film is performed using a wet etching method.

9. The method of claim 1, further comprising forming a gate insulating film between the second vertical pillar and the surrounding gate.

10. The method of claim 9, wherein the process of forming the gate insulating film comprises:
    selectively etching a sidewall of the second vertical pillar; and
    forming an insulating film over a surface of the second vertical pillar.

11. The method of claim 10, wherein the process of selectively etching the second vertical pillar includes an isotropic etch.

12. The method of claim 9, wherein the gate insulating film comprises a silicon oxide film with a thickness in the range of about 1 nm to about 100 nm.

13. The method of claim 1, wherein the surrounding gate comprises one film selected from the group consisting of a polysilicon layer, a metal layer and a combination thereof.

14. The method of claim 13, wherein the polysilicon layer is an undoped polysilicon layer or a doped polysilicon layer.

15. The method of claim 13, wherein the metal layer comprises one film selected from the group consisting of a titanium layer, a titanium nitride film, a titanium nitride film, a tungsten layer, an aluminum layer, a copper layer, a tungsten silicide layer and combinations thereof.

16. A semiconductor device comprising a vertical transistor fabricated by the method of claim 1.

* * * * *